US008773015B2

(12) United States Patent
Yamamoto et al.

(10) Patent No.: US 8,773,015 B2
(45) Date of Patent: Jul. 8, 2014

(54) METHOD FOR MANUFACTURING ORGANIC ELECTROLUMINESCENT ELEMENT HAVING ORGANIC LAYERS WITH PERIODIC STRUCTURE

(75) Inventors: Kyoko Yamamoto, Tsukuba (JP); Jarrett Dumond, Singapore (SG); Hong Yee Low, Singapore (SG)

(73) Assignees: Sumitomo Chemical Company, Limited, Tokyo (JP); Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/508,222

(22) PCT Filed: Nov. 9, 2010

(86) PCT No.: PCT/JP2010/069892
§ 371 (c)(1),
(2), (4) Date: Aug. 21, 2012

(87) PCT Pub. No.: WO2011/058957
PCT Pub. Date: May 19, 2011

(65) Prior Publication Data
US 2012/0306357 A1    Dec. 6, 2012

(30) Foreign Application Priority Data
Nov. 10, 2009 (JP) ................................. 2009-257138

(51) Int. Cl.
*H05B 33/10* (2006.01)
*H05B 33/14* (2006.01)

(52) U.S. Cl.
USPC .............. 313/504; 313/506; 313/507; 445/50

(58) Field of Classification Search
USPC .............................. 313/498–512; 445/24–25
See application file for complete search history.

(56) References Cited

U.S. PATENT DOCUMENTS

| 6,133,691 A | 10/2000 | Nakayama et al. |
| 6,392,338 B1 | 5/2002 | Hori et al. |

(Continued)

FOREIGN PATENT DOCUMENTS

| EP | 1615472 A1 | 1/2006 |
| GB | 2361356 A | 10/2001 |

(Continued)

OTHER PUBLICATIONS

Jie Liu, et al., "High performance organic light-emitting diodes fabricated via a vacuum-free lamination process", Applied Physics Letters, Jun. 2006, vol. 88.

(Continued)

*Primary Examiner* — Tracie Y Green
(74) *Attorney, Agent, or Firm* — Sughrue Mion, PLLC

(57) ABSTRACT

Disclosed is a method for manufacturing an organic electroluminescent (EL) element which is provided with a pair of electrodes and two or more organic layers disposed between the electrodes, and which includes light-emitting layers as the two or more organic layers. The manufacturing method for an organic EL element includes: a step for forming one electrode of the pair of electrodes; a step for forming the two or more organic layers which have a periodic structure wherein the propagation direction of light propagating in a direction substantially perpendicular to the thickness direction of the light-emitting layers is inclined in said thickness direction; and a step for forming the other electrode of the pair of electrodes. In the step for forming the two or more organic layers, two or more planar layers constituting the organic layers are laminated, and the periodic structure which is periodically arranged in two dimensions is then formed on the two or more planar layers by means of an imprinting method in the plane perpendicular to the thickness direction of the light-emitting layers.

8 Claims, 4 Drawing Sheets

(56) References Cited

U.S. PATENT DOCUMENTS

| | | |
|---|---|---|
| 6,563,261 B1 | 5/2003 | Nakayama et al. |
| 6,704,335 B1 | 3/2004 | Koyama et al. |
| 7,038,373 B2 * | 5/2006 | Arnold et al. .................. 313/506 |
| 7,901,607 B2 * | 3/2011 | Xu et al. ..................... 264/297.4 |
| 2002/0018620 A1 | 2/2002 | Koyama et al. |
| 2003/0184215 A1 | 10/2003 | Nakayama et al. |
| 2005/0035706 A1 | 2/2005 | Nakayama et al. |
| 2005/0194896 A1 | 9/2005 | Sugita et al. |
| 2005/0231104 A1 | 10/2005 | Nakayama et al. |
| 2007/0120136 A1 | 5/2007 | Noda et al. |
| 2008/0100914 A1 | 5/2008 | Suganuma |
| 2011/0168976 A1 * | 7/2011 | Mao ................................ 257/13 |
| 2012/0286250 A1 | 11/2012 | Yamamoto et al. |

FOREIGN PATENT DOCUMENTS

| | | |
|---|---|---|
| JP | 10-229243 A | 8/1998 |
| JP | 11-307266 A | 11/1999 |
| JP | 2000-200687 A | 7/2000 |
| JP | 2002-8868 A | 1/2002 |
| JP | 2002-313554 A | 10/2002 |
| JP | 2004-311419 A | 11/2004 |
| JP | 2005-251488 A | 9/2005 |
| JP | 2008107720 A | 5/2008 |
| JP | 2009-9861 A | 1/2009 |
| JP | 2011044296 A | 3/2011 |
| WO | 2004086821 A1 | 10/2004 |

OTHER PUBLICATIONS

Supplementary European Search Report issued in corresponding EP Application No. 10829916.5, dated Oct. 4, 2013.

Japanese Office Action issued in corresponding JP Application No. 2009-257138, dated Oct. 7, 2013.

Liu, Jie et al., "High performance organic light-emitting diodes fabricated via a vacuum-free lamination process," Applied Physics Letters 88, 223509 (2006).

* cited by examiner (1)

(2)

(3)

(4)

(5)

(6)

(1)

(2)

(1)

(2)

(3)

(4)

(5)

(6)

(1)

(2)

METHOD FOR MANUFACTURING ORGANIC ELECTROLUMINESCENT ELEMENT HAVING ORGANIC LAYERS WITH PERIODIC STRUCTURE

CROSS REFERENCE TO RELATED APPLICATIONS

This application is a National Stage of International Application No. PCT/JP2010/069892 filed Nov. 9, 2010, claiming priority based on Japanese Patent Application No. 2009-257138, filed Nov. 10, 2009, the contents of all of which are incorporated herein by reference in their entirety.

TECHNICAL FIELD

The present invention relates to a method for producing an organic electroluminescent device (hereinafter, also referred to as an organic EL device) and to a display and a lighting device comprising an organic EL device obtained by the production method.

BACKGROUND ART

An organic EL device comprises a pair of electrodes (anode and cathode) and a light-emitting layer disposed between the electrodes. Upon application of voltage to the pair of electrodes, hole injection from the anode and electron injection from the cathode take place, and these holes and electrons bind to each other in the light-emitting layer such that the organic EL device emits light.

One of the pair of electrodes is composed of an optically transparent electrode. Light generated in the light-emitting layer outgoes through the optically transparent electrode. Currently, an indium tin oxide (abbreviated to ITO) thin film is frequently used in this optically transparent electrode.

Since the ITO thin film has a higher refractive index than that of the light-emitting layer or the like, total reflection occurs at the interface of the ITO thin film. Therefore, the most part of light emitted from the light-emitting layer does not outgo and is thus used ineffectively under present circumstances. Thus, for suppressing total reflection by means of a smaller angle of incidence on the electrode (ITO thin film), a method for producing an organic EL device has been proposed, which comprises forming, in an electrode or a light-emitting layer, a diffraction grating by which a traveling direction of light emitted from the light-emitting layer is changed (see e.g., PATENT DOCUMENT 1).

The organic EL device comprises, in addition to the pair of electrodes in a layer form and the light-emitting layer, predetermined organic or inorganic layers, if necessary, between the pair of electrodes and is prepared by stacking this plurality of layers in order on a support substrate. In the method for producing an organic EL device as the conventional art, the organic EL device is prepared by forming a curable resin layer having asperities formed on the surface, on a transparent support substrate and then stacking a plurality of layers in order on this curable resin layer by, for example, a deposition or sputtering method. The plurality of layers can thus be stacked in order on the curable resin layer having asperities formed on the surface to form, on the plurality of layers, a structure with asperities that functions as a diffraction grating.

PRIOR ART DOCUMENT

Patent Document

PATENT DOCUMENT 1: JP-A-2009-9861

SUMMARY OF THE INVENTION

Problems to be Solved by the Invention

A method for producing an organic EL device as the conventional art can form a structure with asperities on a plurality of layers. However, it is difficult to stack these layers such that the surface shapes of the layers perfectly match the shape of the asperities on the surface of the curable resin layer. Thus, the shapes of asperities of the layers are gradually flattened with distance from the curable resin layer. For the conventional production method, it is thus difficult to form the desired shape of asperities on layers disposed between a pair of electrodes. Moreover, for forming such a shape of asperities, the conventional production method requires forming the curable resin layer which is unnecessary for the structure of the organic EL device and thus presents the problem of an increased number of steps.

Thus, an object of the present invention is to provide a method for producing an organic EL device, which can easily form a desired structure for suppressing total reflection occurring at an electrode, in layers disposed between a pair of electrodes.

Means for Solving the Problems

The present invention relates to (1) a method for producing an organic electroluminescent device comprising a pair of electrodes and two or more organic layers disposed between the electrodes, the two or more organic layers including a light-emitting layer, the method comprising the steps of:
  forming one electrode of a pair of electrodes;
  forming two or more organic layers having a periodic structure by which a traveling direction of light which travels in a direction almost perpendicular to a thickness direction of the light-emitting layer is inclined in the thickness direction; and
  forming the other electrode of the pair of electrodes, wherein
  the step of forming two or more organic layers comprises
    stacking two or more planar layers serving as the organic layers, and
    then further forming, by an imprinting method in the two or more planar layers stacked, the periodic structure which is two-dimensionally placed with periodicity in a plane perpendicular to the thickness direction of the light-emitting layer.

The present invention relates to (2) the method for producing an organic electroluminescent device according to (1), wherein the organic layers having the periodic structure which is two-dimensionally placed with periodicity are organic layers containing a polymer compound.

The present invention relates to (3) a display comprising an organic electroluminescent device prepared by a production method according to (1) or (2).

The present invention relates to a lighting device comprising an organic electroluminescent device prepared by a production method according to (1) or (2).

Advantages of the Invention

The present invention can easily produce an organic EL device in which a desired structure for suppressing total reflection occurring at an electrode is formed in layers disposed between a pair of electrodes.

BEST MODE FOR CARRYING OUT THE INVENTION

An organic EL device of the present embodiment comprises a pair of electrodes and two or more organic layers disposed between the electrodes, the two or more organic layers including a light-emitting layer. The organic EL device of the present embodiment is usually formed by stacking the pair of electrodes and the two or more organic layers in order on a support substrate.

The pair of electrodes differs from each other in polarity and is respectively provided as an anode or a cathode. Moreover, one of the pair of electrodes is composed of an optically transparent electrode. The other electrode differing in polarity from this optically transparent electrode may be an optically transparent electrode or an opaque electrode and is preferably composed of a reflecting electrode that reflects light toward the optically transparent electrode.

As described above, two or more organic layers are disposed between the pair of electrodes. A light-emitting layer is disposed as at least one of these two or more organic layers between the pair of electrodes. Specifically, at least one light-emitting layer is disposed between the pair of electrodes. In this context, in addition to the light-emitting layer, predetermined organic layers may be disposed between the pair of electrodes. Moreover, two or more light-emitting layers may be disposed between the pair of electrodes. Furthermore, an inorganic layer made of an inorganic material or a mixture layer made of organic and inorganic materials may be disposed between the pair of electrodes.

Figure 1:
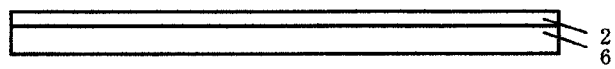
FIG. 1 is a diagram schematically showing a method for producing an organic EL device.
Figure 1:
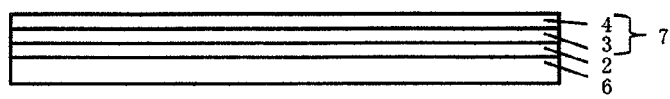
Figure 1:
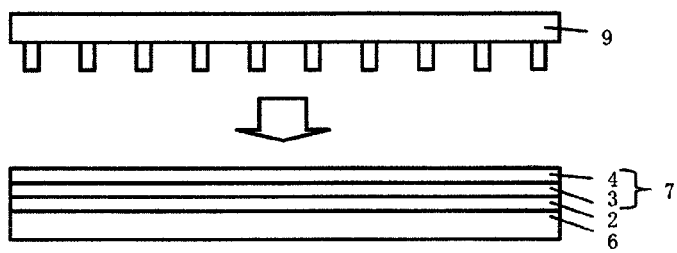
Figure 1:
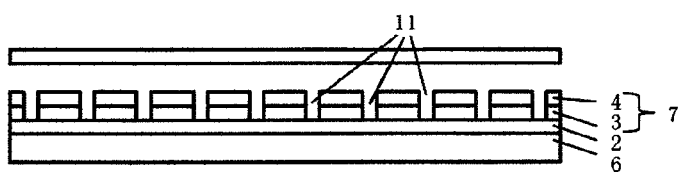
Figure 1:
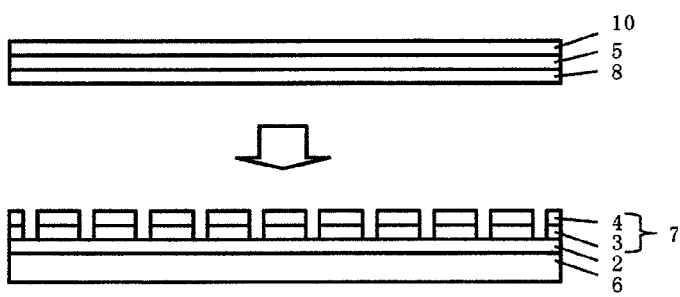
Figure 1:
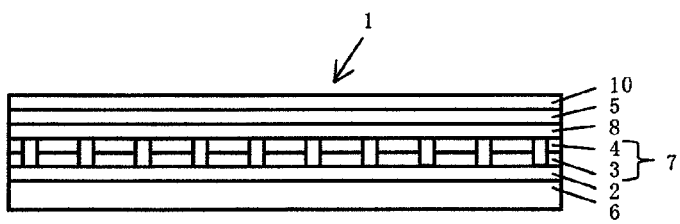

Hereinafter, a method for producing an organic EL device according to an embodiment of the present invention and the structure of the organic EL device will be described with reference to FIGS. 1 and 2. FIG. 1 is a diagram schematically showing the method for producing an organic EL device.

The method for producing an organic EL device according to the present invention comprises the steps of: forming one electrode of a pair of electrodes; forming two or more organic layers; and forming the other electrode of the pair of electrodes, wherein the step of forming two or more organic layers comprises stacking two or more planar layers serving as the organic layers, and then further forming, by an imprinting method in the two or more planar layers stacked, a periodic structure which is two-dimensionally placed with periodicity in a plane perpendicular to the thickness direction of the light-emitting layer. The organic layers thereby formed have the periodic structure by which a traveling direction of light which travels in a direction almost perpendicular to the thickness direction of the light-emitting layer is inclined in the thickness direction.

The organic EL device of the present invention comprises two or more organic layers between the pair of electrodes. In the present embodiment, the organic EL device is described, which comprises a hole injection layer and a light-emitting layer as the two or more organic layers. FIG. 1 shows, as an exemplary embodiment, a method for producing an organic EL device 1 which is constructed by stacking one electrode 2, a hole injection layer 3, a light-emitting layer 4, an electron injection layer 8, the other electrode 5, and a sealing member 10 in this order on a support substrate 6. An optically transparent substrate is used as the support substrate 6 in a so-called bottom emission-type organic EL device having a structure in which light emitted from the light-emitting layer 4 outgoes through the support substrate 6. On the other hand, the support substrate 6 may be an optically transparent substrate or an opaque substrate in a so-called top emission-type organic EL device having a structure in which light emitted from the light-emitting layer 4 outgoes through the other electrode 5.

<Step of Forming One Electrode>

The one electrode 2 is disposed on the support substrate 6. This one electrode 2 is planar in shape with a flat principal surface at both sides. Specifically, the one electrode 2 has no asperities formed on the surface. In the bottom emission-type organic EL device, an optically transparent electrode is used as the one electrode 2. Moreover, in the top emission-type organic EL device, a reflecting electrode that reflects light toward the other electrode 5 is preferably used as the one electrode 2.

As shown in FIG. 1 (1), the support substrate 6 described later is first prepared, and the one electrode is formed on this support substrate 6 by a predetermined method described later.

In the present embodiment, the one electrode 2 is provided as an anode. In the present embodiment, the organic EL device is described, which has a structure in which of the pair of electrodes, the electrode functioning as an anode is placed closer to the support substrate 6, while the electrode functioning as a cathode is placed at a greater distance from the support substrate 6. On the contrary, the organic EL device may have a structure in which of the pair of electrodes, the electrode functioning as a cathode is placed closer to the support substrate, while the electrode functioning as an anode is placed at a greater distance from the support substrate.

<Step of Forming two or More Organic Layers>

The step of forming two or more organic layers comprises stacking two or more planar layers serving as the organic layers, and then further forming, by an imprinting method in the two or more planar layers stacked, a periodic structure which is two-dimensionally placed with periodicity in a plane perpendicular to the thickness direction of the light-emitting layer. The organic layers thereby formed have the periodic structure by which a traveling direction of light which travels in a direction almost perpendicular to the thickness direction of the light-emitting layer is inclined in the thickness direction.

As shown in FIG. 1 (2), in the present embodiment, the hole injection layer 3 and the light-emitting layer 4 are formed as the two or more organic layers.

One planar layer serving as the organic layer (which is the hole injection layer 3 in the present embodiment) is first formed. The planar layer can be formed, for example, by applying an ink containing a material for the layer to the one electrode by a predetermined application method and drying the ink. For example, the planar layer can be formed by applying thereto an ink containing a material for the hole injection layer 3 described later by a predetermined application method and further drying the ink.

Next, another planar layer serving as the organic layers (which is the light-emitting layer 4 in the present embodiment) is stacked on the thus-formed planar layer serving as the organic layer (which is the hole injection layer 3 in the present embodiment). This planar layer can be formed in the same way as in the planar layer serving as the hole injection layer 3. For example, the planar layer serving as the light-emitting layer 4 can be formed by applying thereto an ink containing a material for the light-emitting layer 4 described later by a predetermined application method and further drying the ink.

Next, as shown in FIG. 1 (3), a periodic structure is formed by an imprinting method (so-called embossing method) in the planar layers thus stacked.

In the imprinting method, a mold having predetermined protrusions formed thereon is used, and the periodic structure is formed by transferring this shape on the mold to the planar layers thus stacked. For example, a mold having protrusions formed at positions corresponding to depressions 11 to be formed in a laminate 7 of the hole injection layer 3 and the light-emitting layer 4 is used, and the periodic depressions 11 can be formed in the laminate 7 by pressing this mold into the planar layers such that the structure on the mold is transferred thereto. When the structure formed by the imprinting method is of nano size, this imprinting method may be referred particularly to as nano-imprinting.

A method suitable for a member to undergo imprinting can be used as the imprinting method. Examples thereof can include thermal imprinting and photo-imprinting methods. The thermal imprinting method can be applied to a thermoplastic member. For example, the mold in a heated state can be pressed into a thermoplastic member such that the shape on the mold is transferred to the member. For example, the mold heated to a temperature higher than the glass transition temperature of the thermoplastic member is preferably pressed into the thermoplastic member such that the shape on the mold is transferred to the member. Alternatively, the photo-imprinting method can be applied to a member containing a material that is curable upon light irradiation, such as a photo-curable monomer. For example, a photo-curable monomer can be polymerized by UV irradiation with the mold pressed thereinto such that the shape on the mold is transferred to the member.

In the present embodiment, the hole injection layer 3 and the light-emitting layer 4 are provided as the two or more organic layers. Then, a periodic structure is formed in this laminate 7 of the hole injection layer 3 and the light-emitting layer 4. Specifically, in the laminate 7 of the hole injection layer 3 and the light-emitting layer 4, a two-dimensional periodic structure is formed, by which a traveling direction of light which travels in a direction almost perpendicular to the thickness direction of the light-emitting layer is inclined in the thickness direction.

In the present embodiment, a plurality of depressions 11 that extend in the thickness direction of the laminate of the hole injection layer and the light-emitting layer are formed as the two-dimensional periodic structure in the laminate 7 of the hole injection layer 3 and the light-emitting layer 4. This plurality of depressions 11 are two-dimensionally formed with predetermined periodicity in a plane perpendicular to the thickness direction of the laminate 7 of the hole injection layer 3 and the light-emitting layer 4.

These depressions 11 may or may not penetrate the laminate 7 of the hole injection layer 3 and the light-emitting layer 4. Furthermore, when the depressions 11 do not penetrate the laminate 7 of the hole injection layer 3 and the light-emitting layer 4, these depressions 11 are formed to extend from the principal surface, on the other electrode 5 side, of the light-emitting layer toward the one electrode 2 side.

Examples of the shape specified by surfaces facing the depressions 11 (i.e., the shape of the depressions 11) include a cylinder, a polygonal column, a cone, a polygonal pyramid, a truncated cone, and a truncated pyramid.

Figure 2:
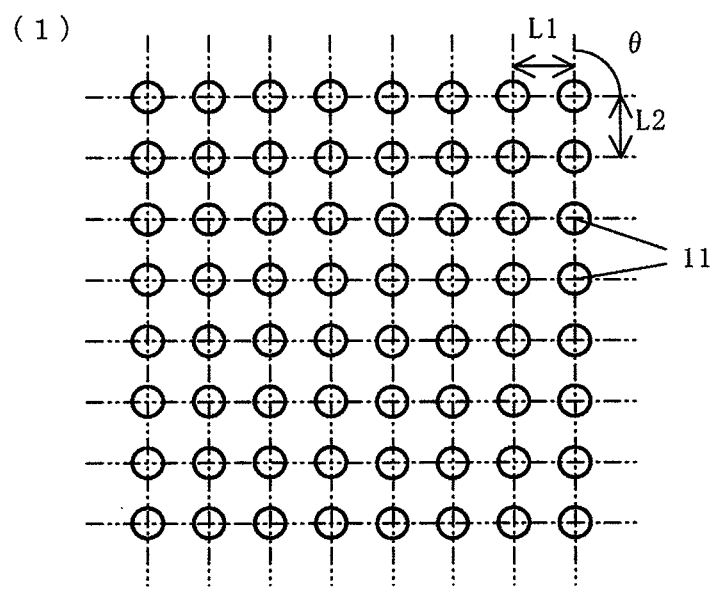
FIG. 2 schematically shows the placement of depressions 11.
Figure 2:
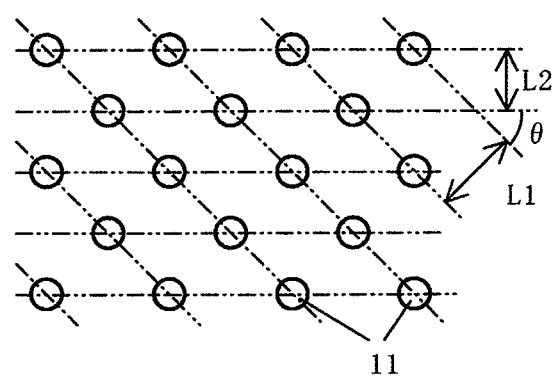

FIG. 2 schematically shows the placement of the depressions 11. FIG. 2 is a diagram of the depression 11 viewed from one side in the thickness direction of the laminate 7 of the hole injection layer 3 and the light-emitting layer 4. On the assumption that the depressions 11 are cylindrical in shape, circular cross sections of the depressions 11 are shown. In this context, the depressions 11 are preferably formed throughout a region in which the pair of electrodes faces each other.

For example, the depressions 11 are placed at the points of intersection between a plurality of first parallel stripes (hereinafter, referred to as vertical stripes) spaced from each other at regular intervals and second parallel stripes (hereinafter, referred to as horizontal stripes) spaced from each other at regular intervals. In FIG. 2, the vertical stripes and the horizontal stripes are respectively represented by a chain double-dashed line. An angle θ of intersection between the vertical stripes and the horizontal stripes may be of any degree. Moreover, an interval L1 between the vertical stripes and an interval L2 between the horizontal stripes may be the same or different.

FIG. 2 (1) shows the placement of the depressions 11 in which the angle θ of intersection between the vertical stripes and the horizontal stripes is 90° and the interval L1 between the vertical stripes and the interval L2 between the horizontal stripes are the same. Moreover, FIG. 2 (2) shows the placement of the depressions 11 in which the angle θ of intersection between the vertical stripes and the horizontal stripes is 45° and the interval between the vertical stripes is "$2^{1/2}$" when the interval between the horizontal stripes is defined as "1". Furthermore, for example, the depressions 11 may be placed at the points of intersection between the vertical stripes and the horizontal stripes, wherein the angle θ of intersection between the vertical stripes and the horizontal stripes is 60° (acute angle) and the interval L1 between the vertical stripes and the interval L2 between the horizontal stripes are the same.

The interval L1 between the vertical stripes, the interval L2 between the horizontal stripes, and the angle θ of intersection between the vertical stripes and the horizontal stripes are respectively set to construct a diffraction grating by which a traveling direction of light which travels in a direction almost perpendicular to the thickness direction of the laminate 7 of the hole injection layer 3 and the light-emitting layer 4 is changed such that the direction of light is inclined in the thickness direction of the laminate 7 of the hole injection layer 3 and the light-emitting layer 4. For example, the interval L1 between the vertical stripes and the interval L2 between the horizontal stripes usually range from a distance ($\lambda o/n$) (which is obtained by dividing, by a refractive index (n), one wavelength ($\lambda o$) of light to be used as outgoing light among those emitted from the light-emitting layer 4) to about a few times this distance ($\lambda o/n$) and are preferably on the order of the distance ($\lambda o/n$) which is obtained by dividing, by a refractive index (n), one wavelength of light to be used as outgoing light. In this context, the refractive index refers to that of the member having the periodic structure at the wavelength ($\lambda o$) of light to be used as outgoing light. The refractive index of the member made of an organic material is usually approximately 1.7.

The height of the depressions 11 in the thickness direction of the laminate 7 of the hole injection layer 3 and the light-emitting layer 4 is preferably a height sufficient for diffracting light and is, for example, 40 nm to 2 μm, preferably 60 nm to 51 μm, more preferably 80 nm to 500 nm.

Moreover, the width of the depressions 11 in a direction perpendicular to the thickness direction of the laminate 7 of the hole injection layer 3 and the light-emitting layer 4 is equal to or smaller than a half the interval L1 between the vertical stripes or the interval L2 between the horizontal stripes and is preferably 80 nm to 500 nm, more preferably 100 to 300 nm.

Next, in the present embodiment, the electron injection layer is formed. The electron injection layer 8 may be formed, as shown in an embodiment described later, by charging in the depressions 11 formed in the laminate 7 of the hole injection layer 3 and the light-emitting layer 4. In the present embodiment, the electron injection layer 8 is planar in shape with a flat principal surface at both sides and is formed on the laminate 7 of the hole injection layer 3 and the light-emitting layer 4.

As described above, a plurality of depressions 11 are formed in the laminate 7 of the hole injection layer 3 and the light-emitting layer 4. The planar electron injection layer 8 is formed on this laminate 7 of the hole injection layer 3 and the light-emitting layer 4 such that periodic voids are formed between the laminate 7 of the hole injection layer 3 and the light-emitting layer 4 and the electron injection layer 8.

The electron injection layer of the present embodiment is formed by, for example, a lamination method. As shown in FIGS. 1 (5) and 1 (6), in the present embodiment, the electron injection layer 8 can be formed on the light-emitting layer 4 by stacking the other electrode 5 and the electron injection layer 8 in this order in advance on the predetermined sealing member 10 described later and further laminating thereto this substrate having the other electrode 5 and the electron injection layer 8 stacked thereon. In this context, such formation of the electron injection layer 8 also forms the other electrode 5 and the sealing member 10 simultaneously with the electron injection layer 8. Specifically, a method described in, for example, Appl. Phys. Lett. 88, 223509 (2006) can be used as the lamination method. Moreover, for example, the electron injection layer can also be formed on the laminate of the hole injection layer and the light-emitting layer by forming the electron injection layer in advance on a highly strippable base and further transferring this layer thereto.

<Step of Forming the Other Electrode>

Next, the other electrode 5 is formed on the electron injection layer 8 by a predetermined method. In the present embodiment, the other electrode 5 is provided as a cathode. In this context, in the bottom emission-type organic EL device, a reflecting electrode that reflects light toward the one electrode 2 is preferably used as the other electrode 5. Alternatively, in the top emission-type organic EL device, an optically transparent electrode is used as the other electrode 5.

As described above, the other electrode 5 can be formed on the electron injection layer 8 by stacking the other electrode 5 and the electron injection layer 8 in this order in advance on the predetermined sealing member 10 and further laminating thereto this substrate having the other electrode 5 and the electron injection layer 8 stacked thereon. In this context, when only the electron injection layer 8 is formed in advance on the light-emitting layer 4 instead of the simultaneous stacking of the other electrode 5 and the electron injection layer 8 as described above, the other electrode 5 can be formed on the electron injection layer 8 by, for example, a deposition or lamination method. Moreover, in the present embodiment, for forming two organic layers, i.e., the hole injection layer and the light-emitting layer, imprinting is performed simultaneously in these two organic layers to form the periodic structure in all the organic layers. By contrast, for example, when three or more organic layers are used, the periodic structure may be formed in, for example, only two of the three or more layers. Specifically, three or more planar layers are stacked, and then, imprinting using the mold may be performed such that the protrusions on the mold reach only two layers closer to the mold.

As described above, in the present embodiment, the periodic structure can be formed in the laminate 7 of the hole injection layer 3 and the light-emitting layer 4 by simultaneously processing the hole injection layer 3 and the light-emitting layer 4 by an imprinting method. In the conventional art, a curable resin layer having asperities formed on the surface is formed on a support substrate, and a plurality of layers are formed on this curable resin layer. Therefore, the shapes of asperities of the layers are gradually flattened with distance from the curable resin layer. For the conventional art, it is thus difficult to form the desired shape of asperities on these layers. By contrast, by use of the imprinting method, the desired periodic structure can be formed in the two or more organic layers (which are the hole injection layer 3 and the light-emitting layer 4 in the present embodiment). Moreover, for forming such a shape of asperities, the conventional art requires forming the curable resin layer which is unnecessary for the structure of the organic EL device and thus has an increased number of steps. By contrast, the present invention does not require providing such a curable resin layer and can thus have simplified steps. Furthermore, in the conventional art, asperities are formed on each of a pair of electrodes. By contrast, in the present embodiment, the periodic structure is formed by processing the two or more organic layers (which are the hole injection layer 3 and the light-emitting layer 4 in the present embodiment). Therefore, the one electrode 2 placed closer to the support substrate can be formed in a planar shape. Furthermore, the other electrode can also be formed in a planar shape. As a result, a uniform electric field can be generated between the electrodes.

In the present embodiment, the periodic structure is formed in the laminate 7 consisting of the hole injection layer and the light-emitting layer. However, the periodic structure may be formed by the imprinting method in a laminate comprising, for example, a hole injection layer, a hole transport layer, and a light-emitting layer.

Figure 3:
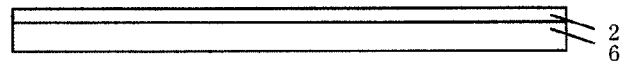
FIG. 3 is a diagram schematically showing a method for producing an organic EL device according to an embodiment of the present invention.
Figure 3:
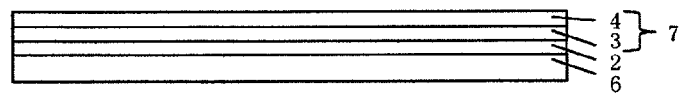
Figure 3:
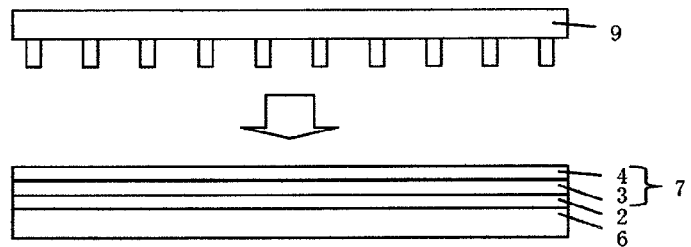
Figure 3:
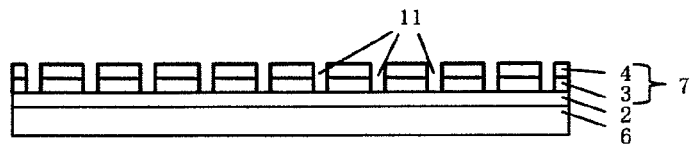
Figure 3:
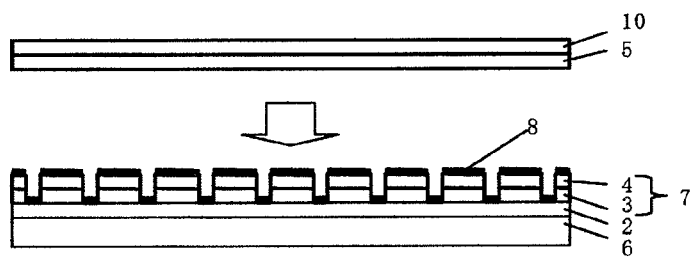
Figure 3:
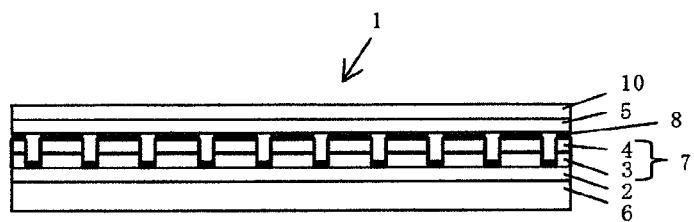

FIG. 3 schematically shows a method for producing an organic EL device according to another embodiment of the present invention. The production method of the present embodiment differs from that of the preceding embodiment only in the steps of forming the electron injection layer 8 and the other electrode 5. Thus, in the description below, the same reference numerals as those in the preceding embodiment will be used to designate the corresponding components, so that the description will be omitted.

In the present embodiment, the electron injection layer is formed by, for example, a deposition method. In this case, as shown in FIG. 3 (5), the electron injection layer 8 is formed not only on the surface of the laminate 7 of the hole injection layer 3 and the light-emitting layer 4 but also in small amounts in the depressions 11 in the laminate 7.

Next, the other electrode is formed. The other electrode 5 can be formed on the electron injection layer 8 by stacking the other electrode on the sealing member 10 as shown in FIG. 3 (6) and further laminating thereto this substrate having the other electrode 5 stacked thereon.

In this context, when the other electrode 5 is formed by a deposition method, the other electrode 5 is formed not only on the electron injection layer 8 but also in the depressions 11 in the laminate 7.

The organic EL device of each of the embodiments is usually provided with a sealing member for sealing the organic EL device. In this context, the sealing member 10 can also be formed simultaneously with the other electrode 5, as described above, in the formation of the other electrode 5 by the lamination method.

For further improving light extraction efficiency, the organic EL device of each of the embodiments preferably has asperities formed on, for example, the surface from which light outgoes (i.e., at the air interface). For example, the bottom emission-type organic EL device preferably has asperities formed on the surface of the support substrate. The top emission-type organic EL device preferably has asperities formed on the surface of the sealing member.

The asperities formed thereon are preferably, for example, asperities among which difference in height is between 0.1 μm and 0.2 mm inclusive. The formation of such asperities can suppress total reflection that occurs at the air interface of the substrate or the air interface of the sealing member. In this context, instead of directly forming the asperities on the support substrate or the sealing member, a film having asperities formed on the surface may be laminated to the support substrate or the sealing member. For example, when the film is laminated thereto via a predetermined adhesive layer, the difference in refractive index between the adhesive layer and two members flanking this adhesive layer is preferably 0.2 or lower in terms of an absolute value. The use of such an adhesive layer and a film can suppress light reflection at the film or the adhesive layer.

Hereinafter, the more specific structure of each component constituting the organic EL device and a method for producing the component will be described in detail.

As described above, the organic EL device may comprise, in addition to the light-emitting layer, predetermined layers between the pair of electrodes.

Examples of the layers disposed between the cathode and the light-emitting layer can include an electron injection layer, an electron transport layer, and a hole blocking layer. When both the electron injection layer and the electron transport layer are disposed between the cathode and the light-emitting layer, the layer adjacent to the cathode is referred to as the electron injection layer, while the layer other than this electron injection layer is referred to as the electron transport layer.

The electron injection layer has the function of improving electron injection efficiency from the cathode. The electron transport layer has the function of improving electron injection from the layer adjacent to the surface on the cathode side. The hole blocking layer has the function of blocking hole transport. In this context, when the electron injection layer and/or the electron transport layer have the function of blocking hole transport, these layers also serve as the hole blocking layer in some cases.

The function of blocking hole transport possessed by the hole blocking layer can be confirmed, for example, by preparing a device that generates only hole current and assessing the blocking effect based on a decrease in the current value thereof.

Examples of the layers disposed between the anode and the light-emitting layer can include a hole injection layer, a hole transport layer, and an electron blocking layer. When both the hole injection layer and the hole transport layer are disposed between the anode and the light-emitting layer, the layer adjacent to the anode is referred to as the hole injection layer, while the layer other than this hole injection layer is referred to as the hole transport layer.

The hole injection layer has the function of improving hole injection efficiency from the anode. The hole transport layer has the function of improving hole injection from the layer adjacent to the surface on the anode side. The electron blocking layer has the function of blocking electron transport. In this context, when the hole injection layer and/or the hole transport layer have the function of blocking electron transport, these layers also serve as the electron blocking layer in some cases.

The function of blocking electron transport possessed by the electron blocking layer can be confirmed, for example, by preparing a device that generates only electron current and assessing the blocking effect based on a decrease in the current value thereof.

In this context, the electron injection layer and the hole injection layer may be collectively called a charge injection layer, while the electron transport layer and the hole transport layer may be collectively called a charge transport layer.

When the two-dimensional periodic structure is formed by the imprinting method in these organic layers including the hole injection layer, the hole transport layer, the electron blocking layer, the light-emitting layer, the hole blocking layer, the electron transport layer, and the electron injection layer, various additives may be added for forming the desired shape by the imprinting method. The types of the additives are not particularly limited, and the additives can be added within a range that does not inhibit the function of each layer. For example, when a layer to undergo imprinting has a low viscosity, it is difficult to accurately transfer thereto the shape on the mold. Thus, a predetermined additive may be added for enhancing the viscosity of the layer to undergo imprinting. Such addition of the additive can enhance the viscosity of the layer to undergo imprinting and accurately transfer thereto the shape on the mold such that the periodic structure with the desired shape can be formed in the layer. Moreover, when an easily vaporized additive is used as such an additive, this additive can also be removed, for example, by forming the imprint and then heating the predetermined layers.

In the production method of the present invention, the layers having the periodic structure which is two-dimensionally placed with periodicity preferably contain a polymer for forming the shape therein by the imprinting method. When the desired shape is formed therein by the imprinting method for transferring the shape on the mold, the shape on the mold must be maintained after removal of the mold. The polymer contained therein imparts plasticity to the member. Therefore, the shape is maintained even after removal of the mold. Thus, the desired shape is easily formed. In the present specification, the polymer means a compound having a polystyrene equivalent number-average molecular weight of $10^3$ to $10^8$.

Possible layer structures of the organic EL device of the present embodiment are exemplified by the followings:
a) anode/hole injection layer/light-emitting layer/cathode;
b) anode/hole injection layer/light-emitting layer/electron injection layer/cathode;
c) anode/hole injection layer/light-emitting layer/electron transport layer/cathode;
d) anode/hole injection layer/light-emitting layer/electron transport layer/electron injection layer/cathode;
e) anode/hole transport layer/light-emitting layer/cathode;
f) anode/hole transport layer/light-emitting layer/electron injection layer/cathode;

g) anode/hole transport layer/light-emitting layer/electron transport layer/cathode;
h) anode/hole transport layer/light-emitting layer/electron transport layer/electron injection layer/cathode;
i) anode/hole injection layer/hole transport layer/light-emitting layer/cathode;
j) anode/hole injection layer/hole transport layer/light-emitting layer/electron injection layer/cathode;
k) anode/hole injection layer/hole transport layer/light-emitting layer/electron transport layer/cathode;
l) anode/hole injection layer/hole transport layer/light-emitting layer/electron transport layer/electron injection layer/cathode;
m) anode/light-emitting layer/electron injection layer/cathode;
n) anode/light-emitting layer/electron transport layer/cathode; and
o) anode/light-emitting layer/electron transport layer/electron injection layer/cathode, wherein the symbol "/" represents that two layers described before and after this symbol "/" are stacked adjacently to each other. The same holds true for description below.

The organic EL device of the present embodiment may have two or more light-emitting layers. When the laminate disposed between the anode and the cathode in any one of the layer structures a) to o) is defined as a "structural unit A", examples of the structure of the organic EL device having two light-emitting layers can include a layer structure p) shown below. In this context, the layer structures of two (structural units A) may be the same as or different from each other:
p) anode/(structural unit A)/charge generation layer/(structural unit A)/cathode.

Moreover, the portion corresponding to "(structural unit A)/charge generation layer" is defined as a "structural unit B", examples of the structure of the organic EL device having three or more light-emitting layers can include the following layer structure q):
q) anode/(structural unit B)x/(structural unit A)/cathode, wherein the symbol "x" represents an integer of 2 or larger, and (structural unit B)x represents a laminate comprising x structural units B stacked. Moreover, the layer structures of a plurality of (structural units B) may be the same or different.

In this context, the charge generation layer is a layer that generates holes and electrons upon application of an electric field. Examples of the charge generation layer can include thin films made of vanadium oxide, indium tin oxide (abbreviation: ITO), and molybdenum oxide.

In the embodiments, the organic EL device has been described, in which both the hole injection layer and the light-emitting layer or only the hole injection layer have the periodic structure. In the structures a) to q), one or two or more predetermined layers disposed between the anode and the cathode may have the periodic structure.

<Support Substrate>

For example, glass, plastics, polymer films, and silicon plates, and laminates thereof are used as the support substrate. In this context, in the bottom emission-type organic EL device, an optically transparent substrate is used. In the top emission-type organic EL device, an opaque substrate may be used.

The support substrate preferably has high gas barrier functions. For further improving the gas barrier functions, for example, an inorganic layer made of a metal, a metal oxide, a metal nitride, a metal carbide, or a metal oxynitride, a laminate of the inorganic layer and an organic layer, or an inorganic-organic hybrid layer may be formed on at least one surface of the support substrate.

<Pair of Electrodes>

The pair of electrodes are composed of an anode and a cathode.

For example, thin films of metal oxides, metal sulfides, and metals can be used as the anode. For example, thin films made of indium oxide, zinc oxide, tin oxide, ITO, indium zinc oxide (abbreviation: IZO), gold, platinum, silver, and copper are used as the anode. Among them, the thin films made of ITO, IZO, or tin oxide are preferably used. Moreover, organic transparent conductive films made of polyaniline or derivatives thereof polythiophene or derivatives thereof or the like may be used as the anode.

Materials that have a small work function, easy electron injection to the light-emitting layer, and high conductivity are preferable for the cathode. For example, alkali metals, alkaline-earth metals, transition metals, and metals belonging to Group 13 in the periodic table can be used. Examples of the materials used for the cathode include: metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, and alloys of two or more of these metals or alloys of one or more of the metals with one or more of gold, silver, platinum, copper, manganese, titanium, cobalt, nickel, tungsten, and tin; and graphite or intercalated graphite. In this context, the cathode may comprise a laminate comprising two or more layers stacked. Alternatively, the electron injection layer described later is also used as the cathode in some cases.

As described above, an optically transparent electrode is used as one of the pair of electrodes. For example, films of the metals rendered thin enough to permit visible light transmission therethrough or thin films made of ITO, IZO, or tin oxide can be used as the optically transparent electrode.

The film thicknesses of the anode and the cathode are appropriately set in consideration of required characteristics and simplified steps and are, for example, 10 nm to 10 μm, preferably 20 nm to 1 μm, more preferably 50 nm to 500 nm.

Examples of methods for preparing the anode and the cathode include a vacuum deposition method, a sputtering method, an ion plating method, a plating method, a method which involves thermocompression bonding of a thin metal film, and a lamination method.

<Hole Injection Layer>

Examples of a hole injection material for constituting the hole injection layer include phenylamine compounds, starburst amine compounds, phthalocyanine compounds, oxides (e.g., vanadium oxide, molybdenum oxide, ruthenium oxide, and aluminum oxide), amorphous carbon, polyaniline, and polythiophene derivatives. The hole injection layer can be formed, as described above, by applying an ink containing the material exemplified above by a predetermined application method and further drying the film thus formed.

Examples of a solvent in the ink can include: chlorine solvents such as chloroform, methylene chloride, and dichloroethane; ether solvents such as tetrahydrofuran; aromatic hydrocarbon solvents such as toluene and xylene; ketone solvents such as acetone and methyl ethyl ketone; ester solvents such as ethyl acetate, butyl acetate, and ethyl cellosolve acetate; and water.

Examples of the predetermined application method can include spin coating, casting, micro-gravure coating, gravure coating, bar coating, roll coating, wire bar coating, dip coating, spray coating, screen printing, flexography, offset printing, and inkjet printing methods.

<Hole Transport Layer>

Examples of a hole transport material for constituting the hole transport layer include polyvinylcarbazole and derivatives thereof, polysilane and derivatives thereof, polysiloxane derivatives having aromatic amine in the side chain or the main chain, pyrazoline derivatives, arylamine derivatives, stilbene derivatives, triphenyldiamine derivatives, polyaniline and derivatives thereof, polythiophene and derivatives thereof, polyarylamine and derivatives thereof, polypyrrole and derivatives thereof, poly(p-phenylene vinylene) and derivatives thereof, and poly(2,5-thienylene vinylene) and derivatives thereof.

Among these hole transport materials, the polymer hole transport materials such as polyvinylcarbazole and derivatives thereof, polysilane and derivatives thereof, polysiloxane derivatives having an aromatic amine compound group in the side chain or the main chain, polyaniline and derivatives thereof, polythiophene and derivatives thereof, polyarylamine and derivatives thereof, poly(p-phenylene vinylene) and derivatives thereof, and poly(2,5-thienylene vinylene) and derivatives thereof are preferable as the hole transport material. Polyvinylcarbazole and derivatives thereof, polysilane and derivatives thereof, polysiloxane derivatives having aromatic amine in the side chain or the main chain, and the like are more preferable. Low-molecular hole transport materials are preferably dispersed in a polymer binder for use.

Examples of a method for forming the hole transport layer can include a method using the low-molecular hole transport material, which involves film formation from a mixture solution with a polymer binder and can include a method using the polymer hole transport material, which involves film formation from a solution.

Any solvent that dissolves therein the hole transport material can be used in the film formation from a solution. Examples thereof can include: chlorine solvents such as chloroform, methylene chloride, and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate, and ethyl cellosolve acetate.

The polymer binder mixed therewith is preferably a polymer binder that does not extremely inhibit charge transport. Moreover, the polymer binder preferably used has weak visible light absorption. Examples of the polymer binder include polycarbonate, polyacrylate, polymethyl acrylate, polymethyl methacrylate, polystyrene, polyvinyl chloride, and polysiloxane.

The film thickness of the hole transport layer is, for example, 1 nm to 1 μm, preferably 2 nm to 500 nm, more preferably 5 nm to 200 nm.

<Light-Emitting Layer>

The light-emitting layer comprises an organic material that emits fluorescence and/or phosphorescence, or the organic material with a dopant. The dopant is added for the purpose of, for example, improving luminous efficiency or changing an emission wavelength. The organic material used in the light-emitting layer may be any of low-molecular and polymer compounds. Examples of a light-emitting material for constituting the light-emitting layer include those shown below. In this context, the light-emitting layer, when formed by an application method, preferably contains the polymer compound because the polymer compound is generally more highly soluble in a solvent.

Examples of a dye used as the light-emitting material include cyclopendamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, and pyrazoline dimers.

Examples of a metal complex as the light-emitting material can include metal complexes that have a rare earth metal (e.g., Tb, Eu, or Dy) or Al, Zn, Be, Ir, Pt, or the like as a central metal and an oxadiazole, thiadiazole, phenylpyridine, phenylbenzimidazole, or quinoline structure as a ligand. Examples thereof can include metal complexes that have light emission from the triplet excited state (e.g., iridium complexes and platinum complexes), quinolinol aluminum complexes, benzoquinolinol beryllium complexes, benzoxazolyl zinc complexes, benzothiazole zinc complexes, azomethyl zinc complexes, porphyrin zinc complexes, and phenanthroline europium complexes.

Examples of a polymer as the light-emitting material include poly-p-phenylene vinylene derivatives, polythiophene derivatives, poly-p-phenylene derivatives, polysilane derivatives, polyacetylene derivatives, polyfluorene derivatives, polyvinylcarbazole derivatives, and polymerized forms of the dyes or the metal complexes exemplified above as the light-emitting material.

Of these light-emitting materials, blue light-emitting materials can include distyrylarylene derivatives, oxadiazole derivatives, and polymers thereof, polyvinylcarbazole derivatives, poly-p-phenylene derivatives, and polyfluorene derivatives. Among them, the polymer materials such as polyvinylcarbazole derivatives, poly-p-phenylene derivatives, and polyfluorene derivatives are preferable.

Moreover, green light-emitting materials can include quinacridone derivatives, coumarin derivatives, and polymers thereof, poly-p-phenylene vinylene derivatives, and polyfluorene derivatives. Among them, the polymer materials such as poly-p-phenylene vinylene derivatives and polyfluorene derivatives are preferable.

Moreover, red light-emitting materials can include coumarin derivatives, thiophene ring compounds, and polymers thereof, poly-p-phenylene vinylene derivatives, polythiophene derivatives, and polyfluorene derivatives. Among them, the polymer materials such as poly-p-phenylene vinylene derivatives, polythiophene derivatives, and polyfluorene derivatives are preferable.

Moreover, a mixture of the blue light-, green light-, and red light-emitting materials or a polymer obtained by polymerizing monomers of components serving as these three light-emitting materials may be used as a white light-emitting material. Moreover, light-emitting layers respectively formed using these three light-emitting materials may be stacked to achieve a device that emits white light as a whole.

Examples of dopant materials can include perylene derivatives, coumarin derivatives, rubrene derivatives, quinacridone derivatives, squarylium derivatives, porphyrin derivatives, styryl dyes, tetracene derivatives, pyrazolone derivatives, decacyclene, and phenoxazone. In this context, the thickness of such a light-emitting layer is usually approximately 2 nm to 2000 nm.

Examples of a method for forming the light-emitting layer containing an organic material can include a method which involves applying a solution containing the light-emitting material onto substrate surface, a vacuum deposition method, and a lamination method. Specific examples of a solvent used in the film formation from a solution can include the same solvents as those used as the solvent that dissolves the hole injection material for forming the hole injection layer from a solution.

Examples of the method which involves applying a solution containing the light-emitting material can include the application methods exemplified above.

<Electron Transport Layer>

Examples of an electron transport material for constituting the electron transport layer can include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, and polyfluorene and derivatives thereof.

Of them, oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof, and polyfluorene and derivatives thereof are preferable as the electron transport material. 2-(4-biphenylyl)-5-(4-t-butylphenyl)-1,3,4-oxadiazole, benzoquinone, anthraquinone, tris(8-quinolinol)aluminum, and polyquinoline are more preferable.

Examples of a method for forming the electron transport layer can include a method using the low-molecular electron transport material, which involves vacuum deposition from a powder or film formation from a solution or from a molten state and can include a method using the polymer electron transport material, which involves film formation from a solution or from a molten state. A polymer binder may further be used in combination therewith in the film formation from a solution or from a molten state. Examples of the method for forming the electron transport layer from a solution can include the same methods as those exemplified as the method for forming the hole transport layer from a solution.

The film thickness of the electron transport layer differs in optimum value depending on the material used and can be selected to offer appropriate values of a driving voltage and luminous efficiency. The electron transport layer requires at least a thickness that prevents pinhole formation. The electron transport layer having too thick a film thickness is not preferable because it causes the device to require a high driving voltage. Thus, the film thickness of the electron transport layer is, for example, 1 nm to 1 µm, preferably 2 nm to 500 nm, more preferably 5 nm to 200 nm.

<Electron Injection Layer>

Examples of an electron injection material for constituting the electron injection layer include alkali metals, alkaline-earth metals, alloys containing one or more of these metals, and oxides, halides, and carbonates of the metals, and mixtures of these substances, according to the type of the light-emitting layer. Examples of the alkali metals and the oxides, halides, and carbonates thereof include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Moreover, examples of the alkaline-earth metals and the oxides, halides, and carbonates thereof include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be a laminate comprising two or more layers stacked. Specific examples of the laminate include LiF/Ca. The electron injection layer is formed by, for example, a deposition, sputtering, or printing method. The film thickness of the electron injection layer is preferably approximately 1 nm to 1 µm.

<Sealing Member>

For example, an inorganic layer made of a metal, a metal oxide, a metal nitride, a metal carbide, or a metal oxynitride, a laminate of the inorganic layer and an organic layer, or an inorganic-organic hybrid layer can be used as the sealing member. The inorganic layer is preferably stable in air. Specific examples thereof include thin-film layers made of silica, alumina, titania, indium oxide, tin oxide, titanium oxide, zinc oxide, indium tin oxide, aluminum nitride, silicon nitride, silicon carbide, silicon oxynitride, and combinations thereof. The inorganic layer is more preferably a thin-film layer made of aluminum nitride, silicon nitride, or silicon oxynitride, even more preferably a thin-film layer made of silicon oxynitride.

The organic EL device described above can be used preferably in a curved or planar lighting device (e.g., a planar light source used as a scanner light source) and a display.

The organic EL device 1 of the present embodiment described above has a light-emitting layer as at least one of the two or more organic layers and has a two-dimensional periodic structure in the laminate 7 of the hole injection layer 3 and the light-emitting layer 4. By such a periodic structure formed in the laminate 7 of the hole injection layer 3 and the light-emitting layer 4, a traveling direction of light which travels at an angle that causes total reflection at an electrode (i.e., light having a larger angle of incidence on the electrode than a critical angle, for example, light having an angle of incidence on the electrode close to 90°) can be inclined in a direction perpendicular to the electrode. As a result, total reflection occurring at an electrode can be suppressed, and the resultant light can efficiently outgo.

Moreover, in the present embodiment, the two or more organic layers (which correspond to the laminate 7 of the hole injection layer 3 and the light-emitting layer 4 in the present embodiment) have the periodic structure. The depressions 11 serving as voids are formed in the organic layers (which correspond to the laminate 7 of the hole injection layer 3 and the light-emitting layer 4 in the present embodiment) having this periodic structure. Such formation of the air voids in the depressions 11 in the laminate 7 of the hole injection layer and the light-emitting layer can increase the difference in refractive index between the laminate 7 of the hole injection layer 3 and the light-emitting layer 4 and the inside of depressions 11. Thus, the periodic structure can sufficiently exert functions as a diffraction grating.

In the present embodiment, the laminate 7 of the hole injection layer 3 and the light-emitting layer 4 is placed in the portion exclusive of the depressions 11. On the contrary, the laminate 7 of the hole injection layer 3 and the light-emitting layer 4 may be formed in the region in which the depressions 11 are formed in the present embodiment, while the voids may be provided in the region in which the laminate 7 of the hole injection layer 3 and the light-emitting layer 4 is formed in the present embodiment. Even the periodic structure thus constructed exerts functions as a diffraction grating. In this case, for example, the laminate 7 of the hole injection layer 3 and the light-emitting layer 4 is formed as a plurality of cylinders.

The structure of the present embodiment in which the laminate 7 of the hole injection layer 3 and the light-emitting layer 4 is placed in the portion exclusive of the depressions 11 is more preferable because it offers high mechanical strength.

Moreover, in the present embodiment, the voids are formed in the depressions 11 formed in the laminate 7 of the hole injection layer 3 and the light-emitting layer 4. Alternatively, an insulating material differing in refractive index from the laminate 7 of the hole injection layer 3 and the light-emitting layer 4 is charged into the depressions 11 formed in the laminate 7 of the hole injection layer 3 and the light-emitting layer 4, and the flat electron injection layer 8 may further be disposed thereon.

Examples

<Preparation of Mold>

Figure 4:
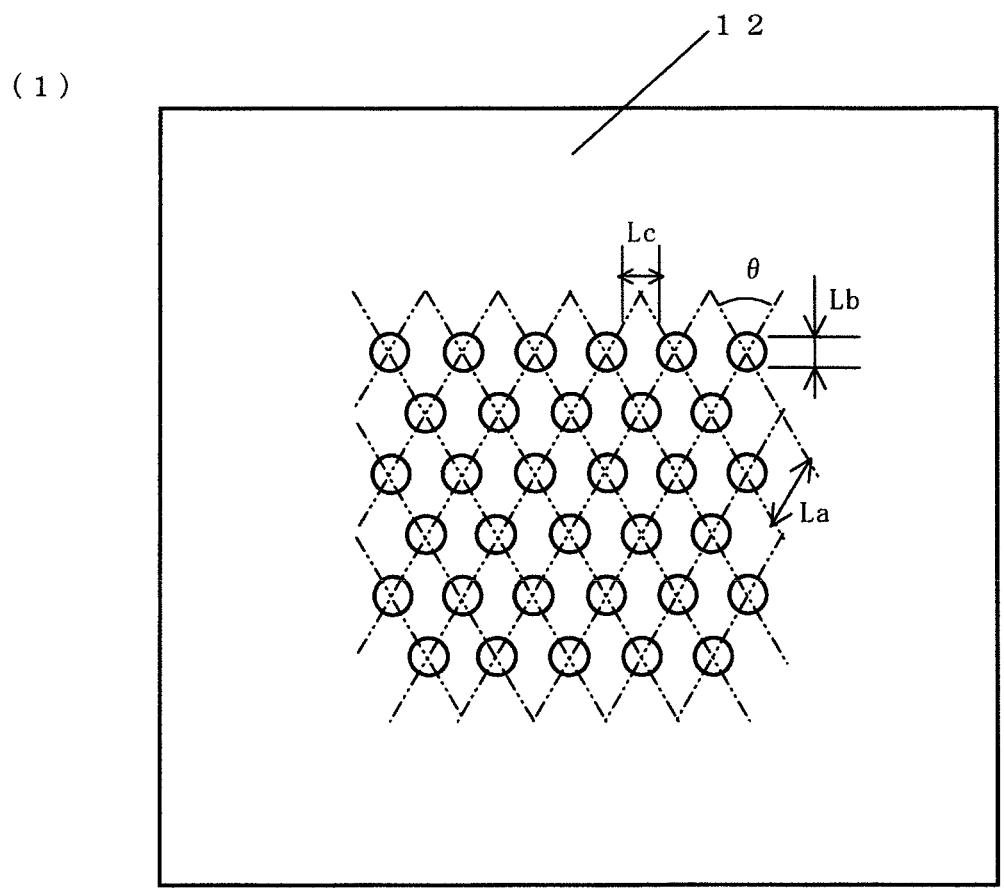
FIG. 4 is a diagram schematically showing a top view and a sectional view of a mold used in Examples.
Figure 4:
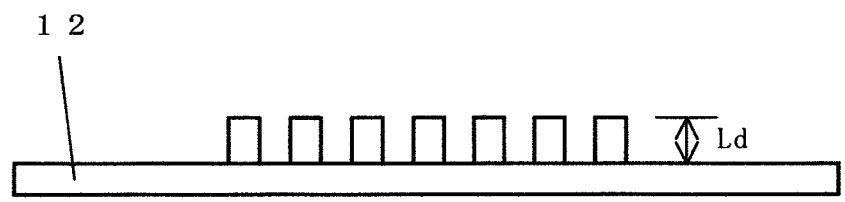

A plurality of cylinders were patterned with two-dimensional periodicity on a member made of Si using an electron beam (EB) lithographic apparatus to prepare a mold 12 made of Si. FIG. 4 is a diagram schematically showing the mold. FIG. 4 (1) shows a top view of the mold, and FIG. 4 (2) schematically shows a sectional view of the mold. The mold has a size of 20 mm×20 mm in a planar view and has a structure with a plurality of cylinders patterned in the central part thereof. The region having the structure with the patterned cylinders has a size of 10 mm×10 mm in the center of the mold in a planar view. Each cylinder has a size of 150 nm in diameter Lb and 160 nm in height Ld. A distance La between the central axes of the adjacent cylinders is 300 nm. Moreover, an angle θ of intersection between the vertical stripes and the horizontal stripes respectively represented by a chain double-dashed line is 60°. An interval Lc between the adjacent cylinders is 150 nm. Imprinting is performed using this mold to form cylindrical holes of 150 nm in diameter at 150-nm intervals in a laminate consisting of a hole injection layer and a light-emitting layer.

<Preparation of Two-Dimensional Periodic Structure>

ITO was patterned at a size of 20 mm×50 mm in the central part on a 50 mm×50 mm glass substrate, and the resultant substrate was ultrasonically washed in acetone, isopropyl alcohol, and ultrapure water and dried by nitrogen blow. The ITO/glass substrate was subjected to UV/ozone treatment for 5 seconds. A suspension of poly(ethylenedioxythiophene)/polystyrene sulfonic acid (manufactured by H.C. Starck-V TECH Ltd.; trade name: AI4083) supplemented with 0.5% glycerol was applied onto the substrate using a spin coater. The resulting substrate was heated at 200° C. for 5 minutes, onto which another suspension of poly(ethylenedioxythiophene)/polystyrene sulfonic acid (manufactured by H.C. Stark-V TECH Ltd.; trade name: AI4083) supplemented with 0.5% glycerol was applied using a spin coater. Thus, a hole transport layer having a total film thickness of 155 nm was obtained. Subsequently, a xylene solution containing a blue light-emitting material Lumation BP361 (manufactured by SUMATION) at a concentration of 1% by mass was applied onto the hole transport layer using a spin coater. The spin coating conditions were adjusted to give a film thickness of 80 nm.

Next, the coated substrate thus obtained and the mold were loaded into a nano-imprinting apparatus (manufactured by Obducat, AB4), and the shape on the mold was transferred at once to the laminate of the hole injection layer and the light-emitting layer in the central part of the coated substrate by imprinting at 180° C. for 5 minutes at a pressure of 60 bars. After the imprinting, the substrate was removed from the mold. After the imprinting, the substrate that underwent imprinting was further subjected to heat treatment at 100° C.

<Evaluation on Structure>

A sample having the laminate of the hole injection layer and the light-emitting layer thus formed on the glass substrate was UV-irradiated at a wavelength of 254 nm from the light-emitting layer side. Blue light outgoing as PL (photoluminescent) light emission from the glass substrate side was measured using an integrating sphere.

In this context, the prepared sample has a region (A) having the periodic structure formed in the laminate of the hole injection layer and the light-emitting layer and a region (B) without the periodic structure formed in the laminate. Specifically, the region (B) is a region having the flat hole injection layer and the flat light-emitting layer stacked on the glass substrate.

When PL light intensity measured using the integrating sphere from the region (B) upon UV irradiation is defined as "1", PL light intensity measured using the integrating sphere from the region (A) upon UV irradiation was 1.9. Thus, the sample having the two-dimensional periodic structure formed in the laminate of the hole injection layer and the light-emitting layer was confirmed to have improved light extraction efficiency in PL light emission. Likewise, an organic EL device prepared using the obtained structure has improved light extraction efficiency.

<Preparation of Organic EL Device>

Al and Ba are deposited in order at thicknesses of 100 nm and 5 nm, respectively, on a sealing glass substrate using a vacuum deposition apparatus to form a cathode and an electron injection layer. In this context, the metal deposition is started after the degree of vacuum reaches $2.5 \times 10^{-4}$ Pa or lower.

Next, a photo-curable sealant is applied to the periphery of the sealing glass substrate using a dispenser. The sealing glass having the cathode and the electron injection layer formed thereon is laminated to the substrate having the ITO, the hole injection layer, and the light-emitting layer formed thereon. The lamination is performed in a nitrogen atmosphere. Furthermore, sealing is performed UV-curing the photo-curable sealant to prepare an organic EL device.

Evaluation on EL Characteristics

The prepared device has improved light extraction efficiency, as in the evaluation on PL shown above.

INDUSTRIAL APPLICABILITY

Description of Reference Numerals

1: organic EL device
2: one electrode
3: hole injection layer
4: light-emitting layer
5: the other electrode
6: support substrate
7: laminate of the hole injection layer and the light-emitting layer
8: electron injection layer
9: mold
10: sealing member
11: depressions
12: mold

The invention claimed is:

1. A method for producing an organic electroluminescent device comprising a pair of electrodes and two or more organic layers disposed between the electrodes, the two or more organic layers including a light-emitting layer, the method comprising the steps of:

forming one electrode of a pair of electrodes;

forming two or more organic layers having a periodic structure by which a traveling direction of light which travels in a direction almost perpendicular to a thickness direction of the light-emitting layer is inclined in the thickness direction; and forming the other electrode of the pair of electrodes, wherein the step of forming two or more organic layers comprises
stacking two or more planar layers serving as the organic layers, and
then further forming, by an imprinting method in the two or more planar layers stacked, the periodic structure which is two-dimensionally placed with periodicity in a plane perpendicular to the thickness direction of the light-emitting layer, wherein:
in the imprinting method, a mold having a plurality of predetermined protrusions is pressed on the two or more organic layers;
the protrusions are disposed on the mold at points of intersection between a plurality of first parallel stripes spaced from each other at regular intervals and second parallel stripes spaced from each other at regular intervals;
an angle of intersection is formed between the first parallel stripes and the second parallel stripes; and
an interval L1 between the first parallel stripes and an interval L2 between the second parallel stripes are either the same or different.

2. The method for producing an organic electroluminescent device according to claim 1, wherein the organic layers having the periodic structure which is two-dimensionally placed with periodicity are organic layers containing a polymer compound.

3. A display comprising an organic electroluminescent device prepared by a production method according to claim 1.

4. A lighting device comprising an organic electroluminescent device prepared by a production method according to claim 1.

5. A display comprising an organic electroluminescent device prepared by a production method according to claim 2.

6. A lighting device comprising an organic electroluminescent device prepared by a production method according to claim 2.

7. The method for producing an organic electroluminescent device according to claim 1, wherein each of the protrusions have a height of 80 nm to 500 nm.

8. The method for producing an organic electroluminescent device according to claim 2, wherein each of the protrusions have a height of 80 nm to 500 nm.

* * * * *